United States Patent [19]
Tanizawa
[11] Patent Number: 4,535,258
[45] Date of Patent: Aug. 13, 1985

[54] TRANSISTOR-TRANSISTOR LOGIC CIRCUIT WITH IMPROVED SWITCHING TIMES

[75] Inventor: Tetsu Tanizawa, Kawasaki, Japan
[73] Assignee: Fujitsu Limited, Kawasaki, Japan

[21] Appl. No.: 408,846
[22] Filed: Aug. 17, 1982
[30] Foreign Application Priority Data
Aug. 17, 1981 [JP] Japan ........ 56-128468
[51] Int. Cl.[3] ........ H03K 19/013; H03K 19/092; H03K 17/04
[52] U.S. Cl. ........ 307/454; 307/456; 307/475; 307/270; 307/280
[58] Field of Search ........ 307/443, 445, 446, 456, 307/457, 458, 475, 270, 466, 200 A, 360, 361, 559, 592, 597, 544, 549, 280

[56] References Cited
U.S. PATENT DOCUMENTS
4,413,194 11/1983 Birch ........ 307/443 X
4,413,195 11/1983 Birch ........ 307/443 X
4,449,063 5/1984 Ohmichi et al. ........ 307/456
FOREIGN PATENT DOCUMENTS
122236 9/1981 Japan ........ 307/456

*Primary Examiner*—Stanley D. Miller
*Assistant Examiner*—David R. Bertelson
*Attorney, Agent, or Firm*—Staas & Halsey

[57] ABSTRACT

A transistor circuit including a pull-down circuit. The pull-down circuit functions to discharge electric charges stored in a base of an output transistor of the transistor circuit and comprises a control transistor, a two-terminal unit (impedance means), and a resistor. The stored electric charges are discharged to ground by way of the two-terminal unit and the resistor. The stored electric charges can be discharged selectively when the output transistor is turned off, with the aid of the control transistor.

10 Claims, 13 Drawing Figures

TRANSISTOR-TRANSISTOR LOGIC CIRCUIT WITH IMPROVED SWITCHING TIMES

BACKGROUND OF THE INVENTION

1. Field of the Invention

The present invention relates to a transistor circuit such as a transistor-transistor-logic (TTL) circuit, more particularly to a pull-down circuit for an output transistor in the TTL circuit.

2. Description of the Prior Art

A typical TTL circuit is comprised of a main inverting amplifier composed of transistors, resistors, and a pulldown circuit. The main inverting amplifier receives an input signal IN and produces an inverted phase signal as an output signal OUT. The pull-down circuit functions to discharge electric charges stored at a base of one of the abovementioned transistors, that is, an output transistor, when the output transistor is turned from on to off. This shortens the turn-off time. Accordingly, the level of the output signal OUT quickly rises from "L" (low) to "H" (high).

However, there is a problem with the above-mentioned main inverting amplifier. The problem is that the output signal cannot change stepwise from "L" to "H", and vice versa, but changes with a gradual slope. The reason for this will be explained hereinafter. In any case, this results in a reduced "noise margin" for the operation of the TTL circuit.

SUMMARY OF THE INVENTION

It is an object of the present invention to overcome the problem of reduced noise margin.

The above object is attained by a transistor circuit provided with a pull-down circuit comprised of a two-terminal unit (impedance means), one terminal being connected to an output transistor at its base, the other terminal receiving a signal having the same phase as that of an input signal of the transistor circuit.

BRIEF DESCRIPTION OF THE DRAWINGS

The present invention will be more apparent from the ensuing description with reference to the accompanying drawings, wherein.

DESCRIPTION OF THE PREFERRED EMBODIMENT

Figure 1:
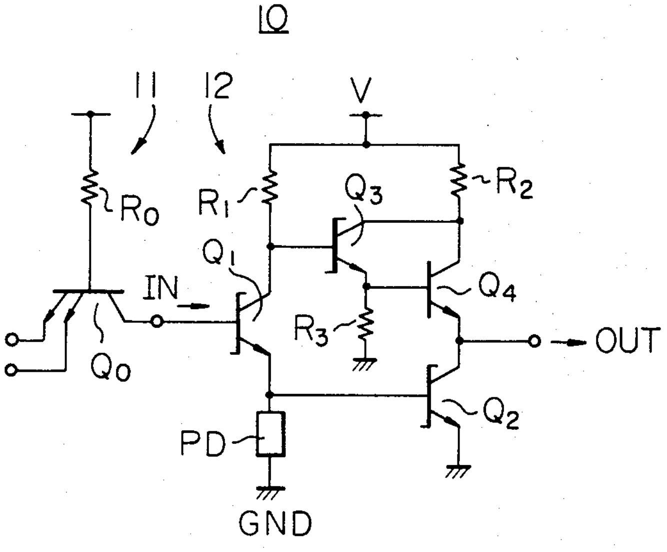
FIG. 1 is a circuit diagram of a main inverting amplifier incorporated in a typical TTL circuit.

FIG. 1 is a circuit diagram of a main inverting amplifier contained in a typical TTL circuit. In FIG. 1, TTL circuit 10 comprising a logic part 11 and a main inverting amplifier 12. The main inverting amplifier 12 is conventionally comprised, as shown in FIG. 1, of transistors $Q_1$, $Q_2$, $Q_3$ and $Q_4$; resistors $R_1$, $R_2$, and a $R_3$; and pull-down circuit PD. Thus, the main inverting amplifier 12 produces an output signal OUT which is an inverted-phase signal with respect to the input signal IN. That is, when the level of the input signal IN at the phase-inverting transistor $Q_1$ is "H", phase-inverting transistor $Q_1$ and also first output transistor $Q_2$ are turned on. At the same time, transistor $Q_3$ and second output transistor $Q_4$ are turned off. The level of the output signal OUT thereby changes to "L". On the other hand, when the level of the input signal IN is "L", phase-inverting transistor $Q_1$ and also the first output transistor $Q_2$ are turned off. At the same time, transistors $Q_3$ and $Q_4$ are turned on. The level of the output signal OUT thereby changes to "H".

The pull-down circuit PD discharges electric charges stored at the base of the first-output transistor $Q_2$ when the transistor is turned from on to off. This shortens the turn-off time. Accordingly, the level of the output signal OUT quickly rises from "L" to "H".

A function similar to the above-mentioned function of the pull-down circuit PD is also achieved by the resistor $R_3$. Resistor $R_3$ discharges electric charges stored at the base of the second output transistor $Q_4$ when the transistor is turned from on to off. This shortens the turn-off time. Accordingly, the level of the output signal OUT quickly falls from "H" to "L".

The pull-down circuti PD is constructed as a two-terminal unit, for example, a resistor. However, there is a problem with such a pull-down circuit. Since the resistor comprising the pull-down circuit PD is connected between ground GND and a node between the base of the first output transistor $Q_2$ and the emitter of the phase-inverting transistor $Q_1$, current can freely flow through the resistor. Therefore, when the level of the input signal IN rises from "L" to "H" and, thereby the phase-inverting transistor $Q_1$ starts turning from off to on, the current starts flowing through the resistor (pull-down circuit PD). Consequently, even though the phase-inverting transistor $Q_1$ starts turning on, it cannot supply current to the base and emitter of the first output transistor $Q_2$ fast enough after turning on since current passes to the circuit PD. In this case, it cannot supply a base current to the first output transistor $Q_2$ until the voltage drop across the pull-down circuit PD exceeds the base-emitter voltage $V_{BE2}$, for example, 0.6 V to 0.8 V, of the first output transistor $Q_2$. Thus, the phase-inverting transistor $Q_1$ starts supplying current even when the first output transistor $Q_2$ is still off, that is, the level of the output signal OUT still remains at the "H" level. At this time, a voltage drop across the resistor $R_1$ is created by the current flowing through the phase-inverting transistor $Q_1$. This voltage drop, on the other hand, reduces the voltage level $V_{OUT}$ of the output signal OUT. The voltage level $V_{OUT}$ is represented by the expression $V-V_{R1}-V_{BE3}-V_{BE4}$, where the symbol V denotes a source voltage, $V_{BE3}$ and $V_{BE4}$ denote, respectively, base-emitter voltages of the transistors $Q_3$ and $Q_4$, and $V_{R1}$ denotes the voltage drop across the resistor $R_1$. Therefore, the voltage level $V_{OUT}$ of the output signal OUT is necessarily reduced due to an increase of the value $V_{R1}$ when transistor $Q_1$ starts turning on.

Figure 2:
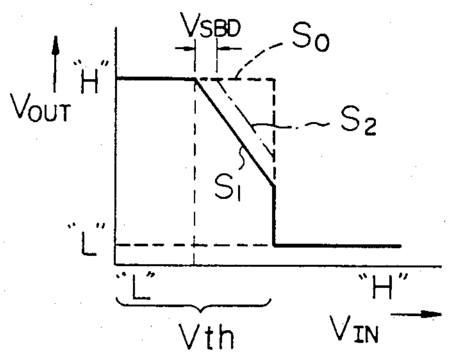
FIG. 2 is a graph for explaining the problem arising in the circuit of FIG. 1.

FIG. 2 is a graph used for explaining the problem arising in the circuit of FIG. 1. Since the main inverting amplifier 12 of FIG. 1 is basically an inverter, the voltage level $V_{OUT}$ should ideally be changed stepwise along the dotted line $S_0$ in FIG. 2 from "H" to "L", and vice versa, in accordance with the change of the voltage level $V_{IN}$ of the input signal IN from "L" to "H", and vice versa. However, the voltage level $V_{OUT}$ does not change stepwise, but changes at a gradual slope such as shown by the solid line $S_1$ in FIG. 2. This is because, as previously mentioned, the voltage drop $V_{R1}$ increases when transistor $Q_1$ starts turning on. It should be noted that such a sloping change (curve $S_1$) of the voltage level $V_{OUT}$ reduces the noise margin. That is, it is not a clearly distinguished voltage level $V_{OUT}$, i.e., "H" or "L", when the voltage level $V_{IN}$ varies at levels corresponding to the slope. The threshold voltage seen from the logic part 11 (FIG. 1) must preferably be as large as shown by the symbol $V_{th}$ (FIG. 2). However, the presence of the slope makes the threshold voltage lower than the preferable voltage $V_{th}$. This makes the noise margin during the operation of the TTL circuit very small.

It is possible to minimize the sloped portion by employing a series circuit made of both a resistor and a Schottky barrier diode (SBD) for the pull-down circuit PD. In this case, the slope portion can be minimized to the size of curve $S_2$ shown in FIG. 2. Since the addition of the SBD to the resistor keeps the collector current of the phase-inverting transistor $Q_1$ from flowing until the voltage level $V_{IN}$ of the input signal IN increases enough to turn on the SBD, the forward voltage $V_{SBD}$ of the SBD exceeds about 0.4 V. Until that happens, no voltage drop occurs across the resistor $R_1$ and, accordingly, the voltage level $V_{OUT}$ of output signal OUT, now an H level cannot be reduced. When the voltage level $V_{IN}$ increases enough to turn on the SBD, a voltage drop occurs across the resistor $R_1$ and the voltage level $V_{OUT}$ of the output signal OUT is reduced. Soon after this, transistor $Q_2$ is turned on, and, therefore, the output signal OUT changes to the L level.

As mentioned above, the input-output characteristics of the main inverting amplifier (see 12 of FIG. 1) can be slightly improved by adding an SBD to the resistor. However, this still leaves an undesired sloped portion as shown by the chain dotted curve $S_2$ in FIG. 2. Setting the forward voltage of the SBD higher than, for example, 0.4 V, would further minimize the undesired slope and enable its elimination, however, this would leave no way to discharge the electric charge from the base of the first output transistor $Q_2$ when it turns off.

The degree of the slope is determined by the ratio between the resistance value of the resistor $R_1$ and the resistance value of the resistor contained in the pull-down circuit PD. If the resistance value of the latter is increased, the slope may be made relatively flat, however, this would obstruct the function of the pull-down circuit PD. If the resistance value of the latter is decreased, the function of the pull-down circuit PD may be made sufficient, however, this would create a considerably sized sloped portion. This in turn would reduce the noise margin in the operation of the TTL circuit and, at the same time, increase the power loss when the input signal IN is at the "H" level.

Figure 3:
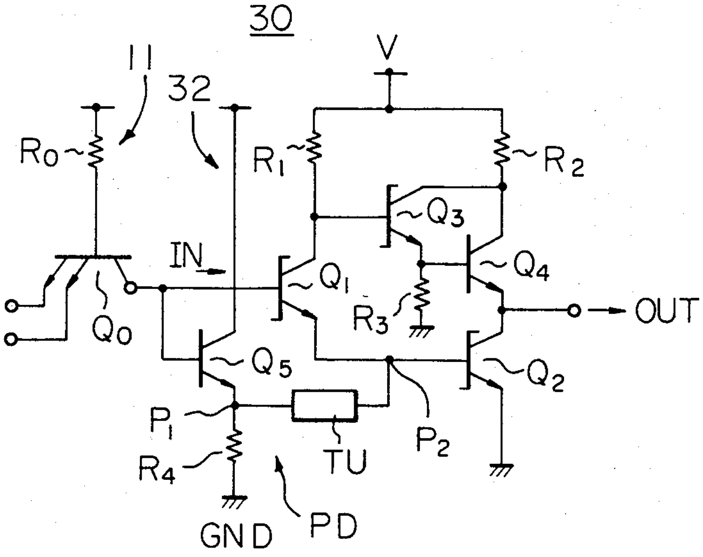
FIG. 3 is a circuit diagram of a TTL circuit according to a first embodiment of the present invention.

The present invention provides an improved pull-down circuit PD, wherein the input-output characteristics show the desired stepwise change. FIG. 3 is a circuit diagram of a TTL circuit according to a first embodiment of the present invention. In FIG. 3, members similar to those of FIG. 1 are represented by the same reference symbols and numerals as those of FIG. 1. The TTL circuit 30 comprises logic part 11 and main inverting amplifier 32. Reference symbol $Q_0$ represents a multi-emitter transistor in the logic part 11. Logic part 11 is provided at its input side with, for example, an OR or AND logic circuit (not shown) and forms, with the main inverting amplifier 32, a NOR gate or NAND gate. Reference symbol $Q_1$ represents the phase-inverting transistor, $Q_2$ the first output transistor, and $Q_4$ the second output transistor. Transistor $Q_3$ forms a Darlington connection transistor together with second output transistor $Q_4$. Thus, phase-inverting transistor $Q_1$ acts as a logic part of the TTL circuit, and transistors $Q_1$, $Q_2$, $Q_3$ and $Q_4$ acts as a main inverting amplifier thereof. As seen from FIG. 3, pull-down circuit PD according to the first embodiment comprises a two-terminal unit (impedance means) TU, a control circuit comprising a control transistor $Q_5$, and resistor $R_4$ connected in series therewith. Thus, a signal having the same phase as the input signal IN is produced at a junction point between the transistor $Q_5$ and resistor $R_4$ at a first terminal of the two-terminal unit TU. The second terminal thereof receives the signal having the same phase as the input signal IN. Therefore, the pull-down function is effective only when the pull-down circuit is to be operated. The operation of the pull-down circuit PD will be clarified hereinafter.

Figure 4A:
FIGS. 4A, 4B, 4C, 4D, 4E and 4F are six examples of the two-terminal unit (impedance means) in FIG. 3.

FIGS. 4A, 4B, 4C, 4D 4E, and 4F are six examples of the two-terminal unit TU of FIG. 3. FIG. 4A is a SBD, FIG. 4B a diode, FIG. 4C a capacitor, FIG. 4D a resistor, FIG. 4E a parallel circuit including a resistor and a capacitor, and FIG. 4F a parallel circuit including a resistor and a diode.

In the TTL circuit of FIG. 3, when the voltage level $V_{IN}$ of the input signal IN changes from "H" to "L", transistor $Q_1$ is turned from on to off and transistor $Q_5$ is also turned off. Simultaneously, the pull-down operation is achieved with the aid of the two-terminal unit TU and the resistor $R_4$, the operation is substantially the same as that of the pull-down circuit PD of FIG. 1. As a result, the first output transistor $Q_2$ is turned off, and an output signal OUT of the "H" level is obtained. In this case, the electric charges stored at the base of the first output transistor $Q_2$ are smoothly discharged to ground GND via the two-terminal unt TU and resistor $R_4$, thus the first output transistor $Q_2$ is quickly turned off.

In the above case, the voltage level $V_{IN}$ of the input signal IN is often higher, when it indicates a logic "L" than the base-emitter voltage $V_{BE5}$ of transistor $Q_5$. In such a case, the transistor $Q_5$ will finally turn on and, therefore, the electric charges at the base of the transistor $Q_5$ cannot be discharged via the two-terminal unit TU and resistor $R_4$. Thus, the desired pull-down operation may not be achieved. However, transistor $Q_5$ is momentarily turned off during the fall of the voltage level $V_{IN}$. Therefore, the electric charges at the base of the first output transistor $Q_2$ are momentarily discharged when transistor $Q_5$ is off. This is because the voltage level at the emitter of the transistor $Q_5$ cannot quickly follow the fall of voltage level $V_{IN}$. Accordingly, since the input signal IN usually varies quickly, first the base level at the base of transistor $Q_5$ falls, and then, after a certain delay time, the voltage level at the emitter falls. Consequently, transistor $Q_5$ can momentarily be turned off during the delay time.

However, when the voltage level $V_{IN}$ of the input signal IN changes from "L" to "H" (and, therefore, the sloped portion shown in FIG. 2 occurs, since transistor $Q_5$ functions as an emitter follower, a voltage level having the same level as the input signal IN appears at a junction point $P_1$. Strictly speaking, the voltage level at the junction point $P_1$ is lower than that of input signal IN by the value of the base-emitter voltage of the transistor $Q_5$. Therefore, no current flows through the two-terminal unit TU (the reason for this will be explained in the next paragraph), and the phase-inverting transistor $Q_1$ remains off and is not turned on until the first output transistor $Q_2$ is turned on. Consequently, no voltage drop $V_{R1}$ occurs across the resistor $R_1$ until the first output transistor $Q_2$ is turned on. This means that no voltage fall of output signal OUT is created during the transient term from the "L" to "H" level of the input signal IN. As a result, no slope is created.

To be more specific, when the voltage level $V_{IN}$ of the input signal IN changes from "L" to "H", the junction point $P_1$ and junction point $P_2$ (corresponding to the respective terminals of the two-terminal unit TU), produce voltages lower than the voltage level $V_{IN}$ of the input signal IN by the base-emitter voltage $V_{BE1}$ of the transistor $Q_1$ and by the base-emitter voltage $V_{BE5}$ of the transistor $Q_5$, respectively. Therefore, if the equation $V_{BE1}=V_{BE5}$ stands, the voltage levels at junction point $P_1$ and $P_2$ are the same. Thus, no current flows through the two-terminal unit TU. In other words, in the above state, the pull-down circuit PD can be disregarded and the aforementioned voltage fall of the output signal OUT, which induces the sloped portion shown in FIG. 2, no longer occurs. In this case, strictly speaking, a current may flow through the transistor $Q_1$ and the two-terminal unit TU toward ground GND, the current creating the voltage equivalence of $V_{BE1}+V_{TU}=V_{BE5}$ ($V_{TU}$ denotes a voltage drop across two-terminal unit TU created by the current). However, it should be noted that such a balancing current is very small and is negligible. That is, the voltage levels at junction points $P_1$ and $P_2$ are, as mentioned above, almost the same.

Figure 5:
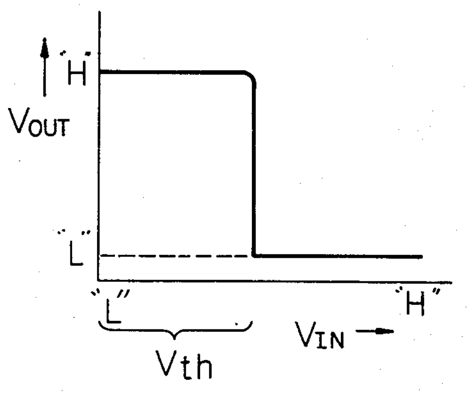
FIG. 5 is a graph representing the input-output characteristics obtained by the circuit shown in FIG. 3.

FIG. 5 is a graph representing the input-output characteristics obtained by the circuit shown in FIG. 3. The curve of FIG. 5 includes no slope as shown in FIG. 2. With reference to both FIGS. 3 and 5, when the voltage level of the input signal IN is "H", the voltage levels at the junction points $P_1$ and $P_2$, which are each adjacent to a terminal of the two-terminal unit TU, are the same as previously explained. To be more specific, the voltage level at the junction point $P_2$ is higher than the ground level GND by $V_{BE2}$ which is the base-emitter voltage of first output transistor $Q_2$. The voltage level $V_{IN}$ of the input signal IN is clamped to a level higher than the level at the junction point $P_2$ by $V_{BE1}$ which is the base-emitter voltage of the transistor $Q_1$. On the other hand, the voltage level at the junction point $P_1$ is lower than those voltage level $V_{IN}$ by $V_{BE5}$ which is the base-emitter voltage of the transistor $Q_5$. In this case, the base-emitter voltages of the transistors are usually the same value, i.e., $V_{BE}$. Accordingly, the voltage levels at the junction points $P_1$ and $P_2$ are both higher than the ground level GND by $V_{BE}$. In such a state, when the voltage level $V_{IN}$ of the input signal IN changes from "H" to "L", the voltage level at the junction point $P_1$ changes to ground level via the resistor $R_4$. At this moment, the voltage level at the junction point $P_2$ is still maintained higher than ground level by $V_{BE}$ due to the presence of electric charges stored at the base of the first output transistor $Q_2$, which is conducted because of the input signal IN having the "H" level. During the above-mentioned term, a current flows through the two-terminal unit TU and resistor $R_4$ toward ground GND. As a result, the stored electric charges at the base of the first output transistor $Q_2$ are quickly discharged with the flow of the current.

Figure 4D:
Figure 4B:
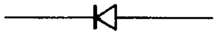

If the diode of FIG. 4A or 4B is employed for realizing the two-terminal unit TU of FIG. 3, a current can flow through the diode until the voltage at the junction point $P_2$ reaches a forward voltage $V_f$ of the diode. This current is not a long-term, continuous current, but a short-term current. In this case, when the transistor $Q_5$ is still not completely turned off, the voltage level at the junction point $P_2$, that is $V_f$, is replaced with $V_{INL}-V_{BE5}+V_f$, where $V_{INL}$ denotes the "L" level of the input signal IN. As mentioned above, even though the current is not a long-term current, but a short-term current, the short-term current is enough for discharging at least the stored electric charge at the base of the first output transistor $Q_2$. Further, it should be noted that since the diode has a static capacitance (that is, a so-called p-n junction capacitance), the stored electric charges, at least, can be discharged with the charging current when the voltage level of the input signal IN changes to the "L" level.

Figure 4E:
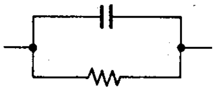
Figure 4C:
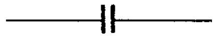

As understood from above, a capacitor can also be employed for the two-terminal unit TU, as proposed in FIG. 4C. If the diode of FIG. 4A or 4B is employed for the two-terminal unit TU, it also has a function similar to that of the capacitor which is available during a transient term from "H" to "L" of the input signal IN. From this viewpoint, a capacitive element is preferable for the two-terminal unit TU. Therefore, each diode of FIGS. 4A and 4B can be connected between the junction points $P_1$ and $P_2$ either in a forward or backward direction.

Figure 4F:
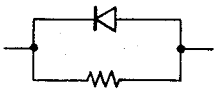

If the resistor of FIG. 4D is employed for the two-terminal unit TU, it is difficult to discharge the stored electric charges, especially during the transient term. However, it is easy to discharge the stored electric charges, after the voltage level difference between points $P_1$ and $P_2$ finally reaches a constant large value. From such a viewpoint, the parallel circuit of both the resistor and the capacitor, as shown in FIG. 4E, is preferable for the two-terminal unit TU. In conclusion, it is the most preferable that the two-terminal unit TU be comprised of the parallel circuit including both the resistor and the diode, as shown in FIG. 4F, because the diode has a static capacitance.

Figure 6:
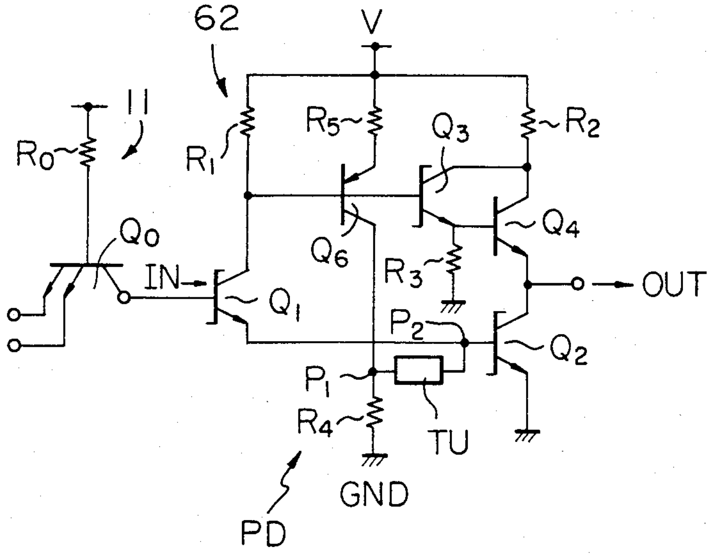
FIG. 6 is a circuit diagram of a TTL circuit according to a second embodiment of the present invention.

FIG. 6 is a circuit diagram of a TTL circuit according to a second embodiment of the present invention. In FIG. 6, members similar to those of FIG. 3 are represented by the same reference symbols and numerals as those of FIG. 3. As seen from FIG. 6, pnp transistor $Q_6$ is newly employed instead of npn transistor $Q_5$ of FIG. 3. However, the operational principle of the main inverting amplifier 62 in FIG. 6 is substantially the same as the main inverting amplifier 32 in FIG. 3. In the second embodiment, a signal having the same phase as that of the input signal IN is produced at the junction point $P_1$ between the two-terminal unit TU and the resistor $R_4$ by way of the pnp transistor $Q_6$. That is, when the level of the input signal IN is "H", the phase-inverting transistor $Q_1$ is turned on. Therefore, the pnp transistor $Q_6$ is also turned on and the "L" level appears at the junction point $P_1$. This means that the signal at the junction point $P_1$ has the same phase as that of input signal IN. However, when the level of the input signal IN changes from "L" to "H", the phase-inverting transistor $Q_1$ starts turning on. At this time, a current starts flowing through the two-terminal unit TU and resistor $R_4$ toward ground GND. However, such a current suddenly stops flowing because when the level at the junction point $P_2$ rises, due to the turning on of the phase-inverting transistor $Q_1$, the level at the junction point $P_1$ also rises due to the turning on of the transistor $Q_6$. Thus, the phase-inverting transistor $Q_1$ cannot be turned on the first output transistor $Q_2$ is turned on. This means no undesired sloped portion is created in the curve of the output signal OUT when it changes from "H" to "L", as in the circuit of FIG. 3.

Figure 7:
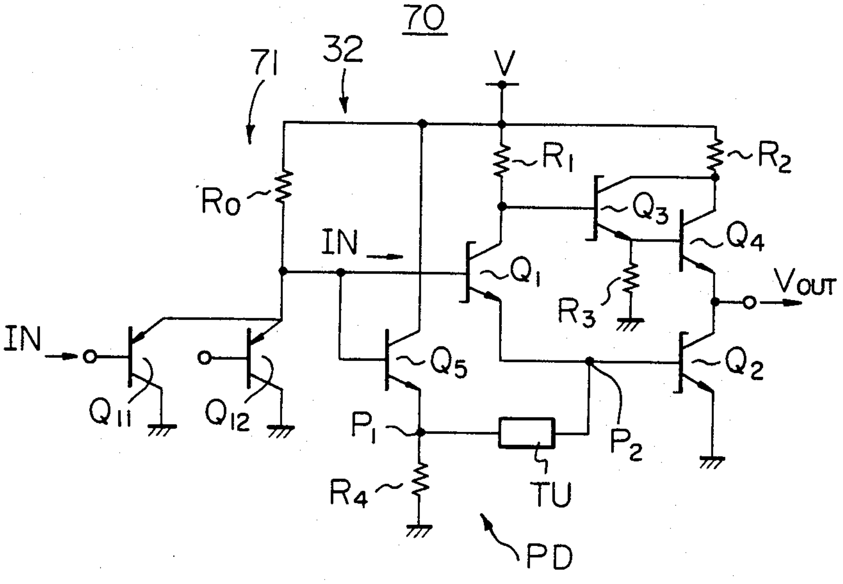
FIG. 7 is a circuit diagram of another example of a TTL circuit to which the present invention is adapted.
Figure 8:
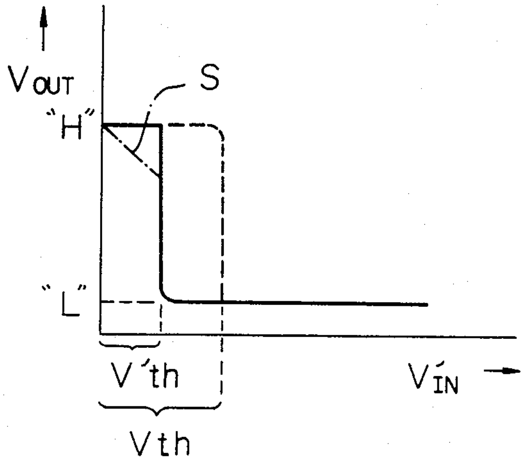
FIG. 8 is a graph representing the input-output characteristics obtained by the circuit shown in FIG. 7.

FIG. 7 is a circuit diagram of another example of a TTL circuit to which the present invention is adapted. FIG. 8 is a graph representing the input-output characteristics obtained by the circuit shown in FIG. 7. It should be understood that the TTL circuit 70, compressing the logic part 71 and the main inverting amplifier 32, is not an embodiment according to the present invention, but an example of a TTL circuit in which the present invention is particularly advantageous. In FIG. 7, logic part 71 includes pnp transistors $Q_{11}$ and $Q_{12}$ and resistor $R_0$, rather than multi-emitter transistor $Q_0$ and resistor $R_0$ as in logic part 11 of FIG. 3.

As previously explained, according to the present invention, the prior art characteristic curves $S_1$ and $S_2$ of FIG. 2 can be improved, so as to obtain the stepwise characteristic curve shown in FIG. 5. This enables a considerably increased threshold voltage $V_{th}$ of the input signal IN, used for determining the boundary of transition in the "H"→"L" or "L"→"H" of the voltage level $V_{OUT}$ of the output signal OUT. This means an enlarged noise margin in the operation of the TTL circuit. The threshold voltage $V_{th}$ shown in FIG. 5 is about $2 \times V_{BE}$.

In the TTL circuit 70, since logic part 71 comprises pnp transistors $Q_{11}$ and $Q_{12}$, the threshold voltage $V_{th}'$, (see FIG. 8 of the input signal IN' is lower than the threshold voltage $V_{th}$ (see FIGS. 5 and 8) of the input signal IN. Therefore, in FIG. 8, if the undesired slope in the input-output characteristic curve is measured, as in curves $S_1$ and $S_2$ of FIG. 2, there would be almost no noise margin (refer to chain-dotted slope portion S in FIG. 8). However, according to the present invention, even though the threshold voltage is as low as the voltage $V_{th}'$, the noise margin can still be maintained, because the input-output characteristic curve changes stepwise.

As mentioned above, according to the present invention, since the pull-down circuit is operated selectively only when it is required, the input-output characteristics of the main inverting amplifier are improved and the noise margin can be increased. Further, since the slope portion of FIG. 2 no longer exists, it is not necessary to take the resistance value of resistor $R_4$ into account in determining the resistance value of resistor $R_1$ (because, as previously mentioned, the inclination degree of the slope is usually determined by the ratio between the resistance values of resistors $R_1$ and $R_4$). Accordingly, the resistance value of the resistor $R_1$ is determined independently from that of the resistor $R_4$, which means increased flexibility in design. Further, it is possible to increase the resistance value of the resistor $R_1$, because resistor $R_1$ is irrelevant to resistor $R_4$. If the resistance value of resistor $R_1$ is large, resistor $R_4$ is not needed to absorb, toward ground, a large current therefrom. In other words, resistor $R_4$ can absorb a large amount of the stored electric charges at the base of transistor $Q_2$, and, thereby, transistor $Q_2$ can quickly be turned from on to off. Thus, a sharp rising edge from "L" to "H" of the output signal OUT can be realized.

I claim:

1. A transistor circuit operatively connectable to a power supply line and a ground line, comprising:
   - an input terminal operatively connected to reveive an input signal;
   - an output terminal;
   - a phase-inverting transistor of a first conductivity type, operatively connected to said input terminal, having a base for receiving the input signal, having a collector operatively connected to the power supply line and having an emitter, and generating an output signal;
   - first and second output transistors, each having a base operatively connected to the emitter and collector, respectively, of said phase inverting transistor and said first transistor having a collector operatively connected to the output terminal, and said second transistor having a collector operatively connected to the power supply line, and said first and second output transistors being alternately turned on and off in response to the output signal of said phase-inverting transistor; and
   - a pull-down circuit, operatively connected to said input terminal and said first output transistor, for discharging electric charges stored in the base of said first output transistor, said pull-down circuit comprising:
     - a control circuit, operatively connected to said input terminal and operatively connected to the power supply line, having an output node for generating a signal having the same phase as the input signal at the output node, said control circuit includes:
       - a control transistor, having a base operatively connected to said input terminal, having a collector operatively connected to the power supply line, and having an emitter connected to said output node for receiving the input signal and generating the signal having the same phase as the input signal; and
       - a resistor operatively connected between the emitter of said control transistor and the ground line; and
     - two-terminal impedance means, operatively connected between the base of said first output transistor and the output node of said control circuit, for providing an impedance.

2. A transistor circuit as set forth in claim 1, wherein said control transistor is of the first conductivity type.

3. A transistor circuit as set forth in claim 1, wherein the base of said control transistor is operatively connected to reveive an inverted input signal and has a second conductivity type opposite to that of the first conductivity type.

4. A transistor circuit as set forth in claim 2 or 3, wherein said two-terminal impedance means comprises a Schottky barrier diode.

5. A transistor circuit as set forth in claim 2 or 3, wherein said two-terminal impedance means comprises a diode.

6. A transistor circuit as set forth in claim 2 or 3, wherein said two-terminal impedance means comprises a capacitor.

7. A transistor circuit as set forth in claim 2 or 3, wherein said two-terminal impedance means comprises a resistor.

8. A transistor circuit as set forth in claim 2 or 3, wherein said two-terminal impedance means comprises a parallel circuit including a capacitor and a resistor.

9. A transistor circuit as set forth in claim 2 or 3, wherein said two-terminal impedance means comprises a parallel circuit including a diode and a resistor.

10. A transistor circuit, operatively connected to a source potential, having an input terminal operatively connected to reveive an input signal and having an output terminal, comprising:

a phase-inverting transistor, having a base operatively connected to the input terminal for receiving the input signal, having a collector operatively connected to the source potential and having an emitter;

first and second output transistors, operatively connected to the output terminal, said first and second output transistors each having a base operatively connected to said phase-inverting transistor and said first and second transistors each having a collector operatively connected to the output terminal and the source potential, respectively.

pull-down means, operatively connected between the input terminal and the base of said first output transistor, for discharging electric charges stored in the base of said first output transistor, comprising:

two-terminal impedance means for providing an impedance, having a first terminal operatively connected to the base of said first output transistor and having a second terminal operatively connected to the input terminal;

a control transistor, having a base operatively connected to the input terminal, having an emitter operatively connected to the second terminal of said two-terminal impedance means and having a collector operatively connected to the source potential; and a resistor operatively connected between the emitter of said control transistor and ground.

* * * * *

UNITED STATES PATENT AND TRADEMARK OFFICE
CERTIFICATE OF CORRECTION

PATENT NO. : 4,535,258

DATED : AUGUST 13, 1985

INVENTOR(S) : TETSU TANIZAWA

It is certified that error appears in the above-identified patent and that said Letters Patent is hereby corrected as shown below:

Col. 1, line 63, "EMBODIMENT" should be --EMBODIMENTS--.

Col. 2, line 2, "and a $R_3$; and" should be --and $R_3$; and a--;
line 30, "circuti" should be --circuit--.

Col. 3, line 24, "slope" should be --sloped--;
line 33, "H level" should be --"H" level,--;
line 38, "L" should be --"L"--.

Col. 4, line 13, "acts" should be --act--;
line 44, "unt" should be --unit--.

Col. 5, line 55, "those" should be --the--.

Col. 7, line 9, "on the" should be --on until the--;
line 18, "pressing" should be --prising--;
line 38, "8" should be --8)--;
line 43, "slope" should be --sloped--;
line 46, "$V_{th}$'" should be --$V'_{th}$--;
line 54, "slope" should be --sloped--.

UNITED STATES PATENT AND TRADEMARK OFFICE
CERTIFICATE OF CORRECTION

PATENT NO. : 4,535,258

DATED : AUGUST 13, 1985

INVENTOR(S) : TETSU TANIZAWA

It is certified that error appears in the above-identified patent and that said Letters Patent is hereby corrected as shown below:

Col. 8, line 7, "reveive" should be --receive--;
line 57, "reveive" should be --receive--.

Signed and Sealed this

*Twenty-ninth* Day of *October 1985*

[SEAL]

*Attest:*

DONALD J. QUIGG

*Attesting Officer*

*Commissioner of Patents and Trademarks—Designate*